(12) United States Patent
Yu

(10) Patent No.: US 6,338,634 B1
(45) Date of Patent: Jan. 15, 2002

(54) SURFACE MOUNT ELECTRICAL CONNECTOR WITH ANTI-WICKING TERMINALS

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/749,131

(22) Filed: Dec. 26, 2000

(30) Foreign Application Priority Data

Oct. 26, 2000 (TW) .......................................... 089218644

(51) Int. Cl.[7] ................................................ H05K 1/00
(52) U.S. Cl. ........................................ 439/83; 439/842
(58) Field of Search ............................... 439/83, 733.1, 439/873, 856, 857, 844, 853, 861, 842, 660

(56) References Cited

U.S. PATENT DOCUMENTS

| | | | | |
|---|---|---|---|---|
| 4,693,528 A | * | 9/1987 | Asick et al. ................... | 439/83 |
| 5,667,393 A | * | 9/1997 | Grabbe et al. ................. | 439/83 |
| 5,882,212 A | * | 3/1999 | McHugh et al. ............... | 439/74 |
| 5,902,136 A | * | 5/1999 | Lemke et al. .................. | 439/74 |
| 5,921,787 A | * | 7/1999 | Pope et al. ..................... | 439/74 |
| 5,938,456 A | * | 8/1999 | Kozel et al. ................... | 439/83 |
| 6,036,504 A | * | 3/2000 | McHugh et al. ............... | 439/74 |
| 6,099,359 A | * | 8/2000 | Yamamuro .................... | 439/736 |
| 6,244,883 B1 | * | 6/2001 | Ito et al. ........................ | 439/247 |

* cited by examiner

Primary Examiner—Gary Paumen
Assistant Examiner—Ross Gushi
(74) Attorney, Agent, or Firm—Wei Te Chung

(57) ABSTRACT

An electrical connector 1 includes an insulative housing 10 and a number of terminals 20 received in the housing 10. Each terminals 20 has a vertically upwardly extended engaging portion 22 which has an inner face 224 for electrically engaging with a pin of a complementary connector and a horizontally extended solder tail 212 which has a bottom face 2121 for surface mounting to a printed circuit board 3. The terminals 20 are formed by stamping a metal sheet, wherein the inner face 224 of the engaging portion 22 and the bottom face 2121 of the solder tail 212 are formed by opposite faces of the metal sheet. A step portion 213 is formed by the terminal 20 between the engaging portion 22 and the solder tail 212. Thus, solder wicking during surface mounting the connector 1 to the printed circuit board 3 can be effectively prevented.

9 Claims, 4 Drawing Sheets

SURFACE MOUNT ELECTRICAL CONNECTOR WITH ANTI-WICKING TERMINALS

BACKGROUND OF THE INVENTION

1. Field of the Invention

The present invention is related to an electrical connector, and particularly to an electrical connector with anti-wicking terminals.

2. Description of the Related Art

Referring to FIGS. 3 and 4 of the present application, a conventional electrical connector includes a plurality of surface mount terminals 9 received in a plurality of passageways 81 of an insulating housing 80. Each terminal 9 comprises a vertical base plate 90, a horizontal soldering portion 91 extending outwardly from a bottom edge of the base plate 90, two mounting arms 93 extending inwardly from two lateral sides of the base plate 90 and three vertical engaging portions 92 extending upwardly from the two arms 93 and a top edge of the base plate 90, respectively. A solder pad 71 is disposed between each soldering portion 91 and a printed circuit board 7 for soldering the terminals 9 to the printed circuit board 7 by using surface mounting technology (SMT) by subject the solder pads 71 to a heat source, for example, an infrared radiation. In the prior art, molten solder may climb upwardly along a bottom face of the soldering portions 91 and then an inner face of the base plate 90 and the mounting arms 93 to contaminate engaging faces 922 of the engaging portion 92. Thus, a signal transmission quality will be adversely affected between the connector and a complementary connector (not shown). Accordingly, an improved electrical connector is required to overcome the disadvantages of the prior art.

BRIEF SUMMARY OF THE INVENTION

An object of the present invention is to provide an electrical connector with anti-wicking terminals which can effectively prevent molten solder from flowing upwardly to contaminate engaging portions of the terminals when the connector is surface mounted to a printed circuit board.

To achieve the above-mentioned object, an electrical connector of the present invention comprises an insulating housing and a plurality of terminals, wherein the insulating housing has a plurality of passageways and the terminals are received in the passageways. Each terminal is formed with a base plate in a corresponding passageway near a central rib of the housing. A pair of mounting arms are received in the corresponding passageway and extend outwardly from two sides of the base plate to fixedly engage with an outer wall of the housing. Two engaging portions are received in the corresponding passageway and extend vertically upwardly from the mounting arms, respectively. Each engaging portion has an inner face for electrically engaging with a pin of a complementary connector. The terminal further has a step portion horizontally outwardly extend from a bottom edge of the base plate. A solder tail extends horizontally outwardly from a bottom edge of a vertical section of the step portion beyond an outer face of the outer wall. Both the solder tail and the vertical section of the step portion are located below a bottom face of the housing. The solder tail has a bottom face for surface mounting to a printed circuit board. The step portion has a horizontal section received in and extends substantially across a bottom of the corresponding passageway.

Other objects, advantages and novel features of the invention will become more apparent from the following detailed description of the preferred embodiments when taken in conjunction with the accompanying drawings.

DETAILED DESCRIPTION OF THE INVENTION

Figure 1:
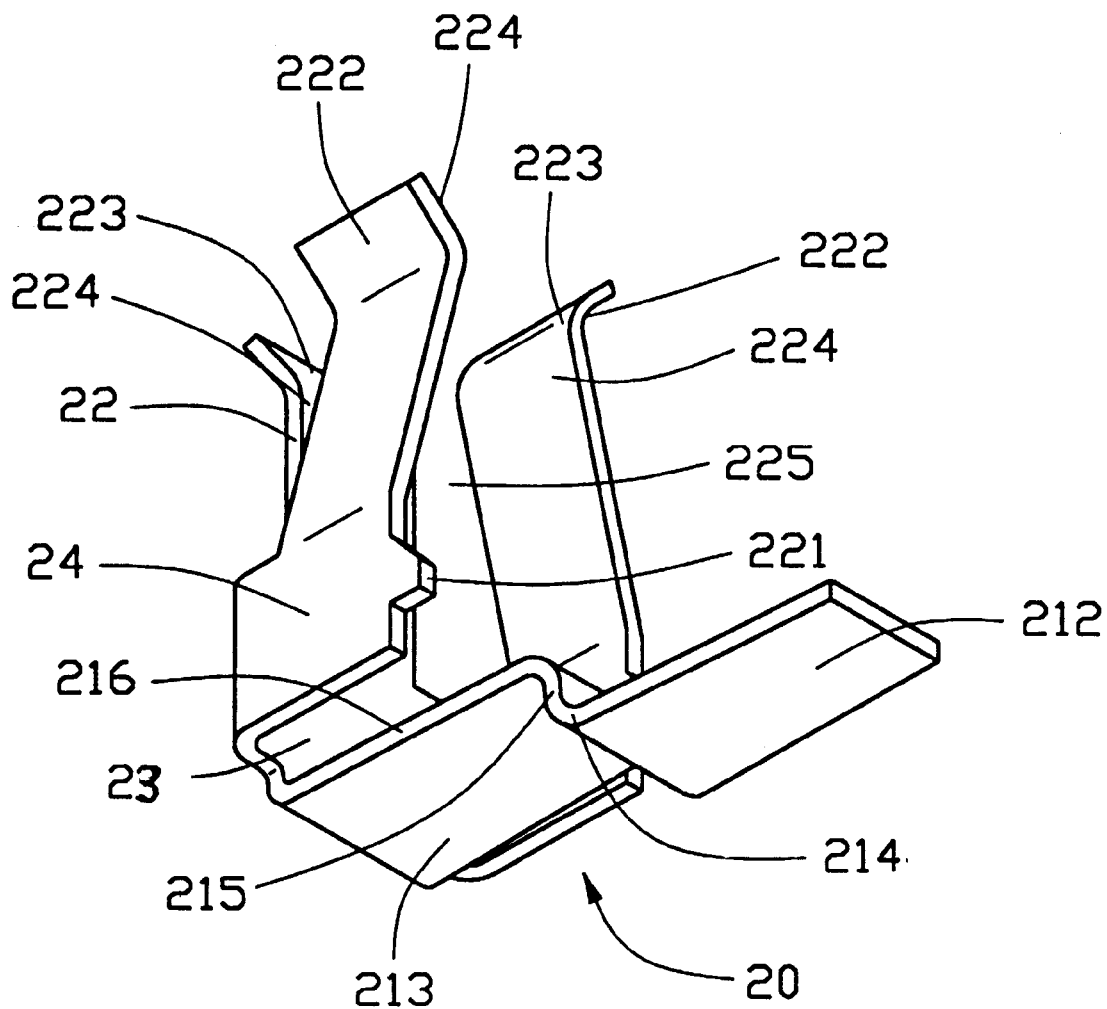
FIG. 1 is perspective view of a terminal for use in an electrical connector in accordance with the present invention.
Figure 2:
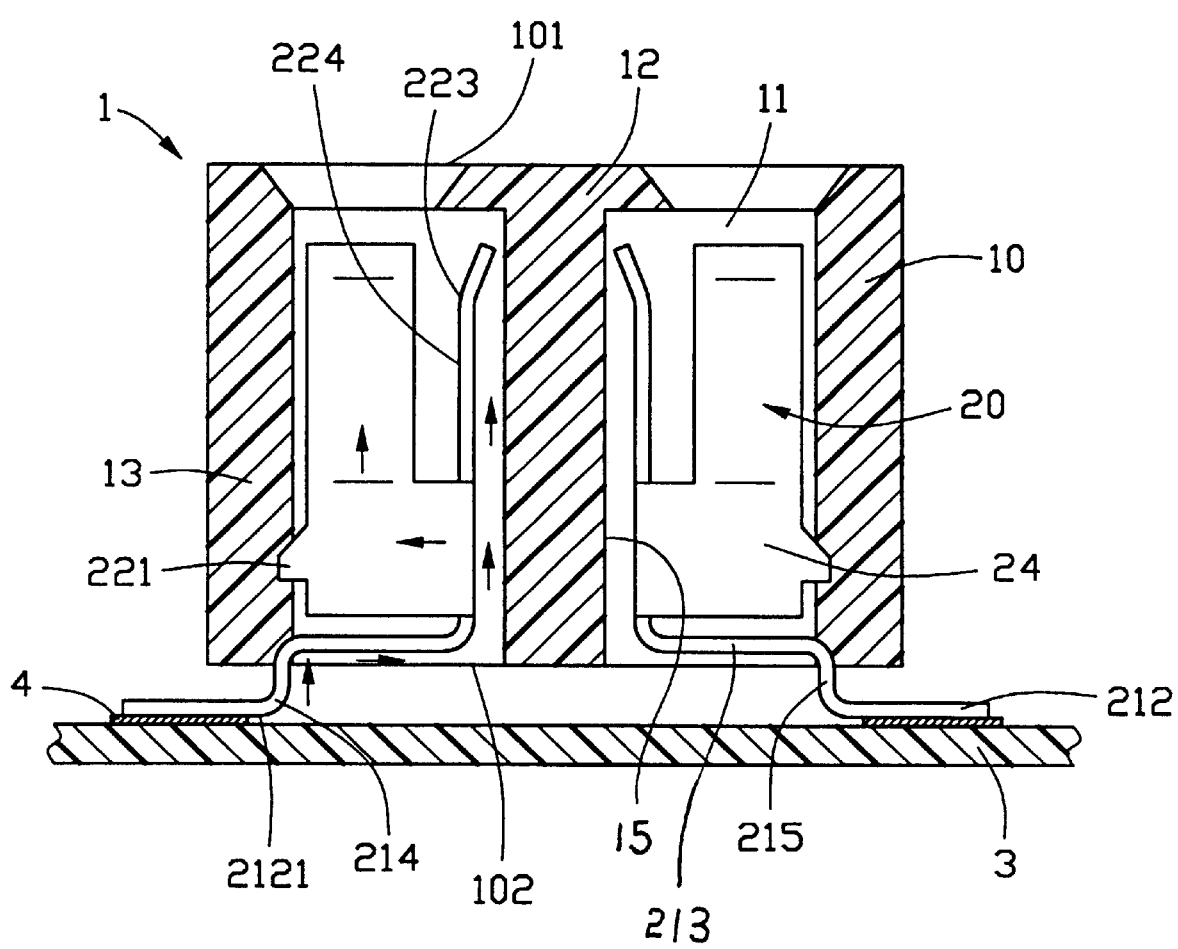
FIG. 2 is a cross-sectional view of the electrical connector in accordance with the present invention.
Figure 3:
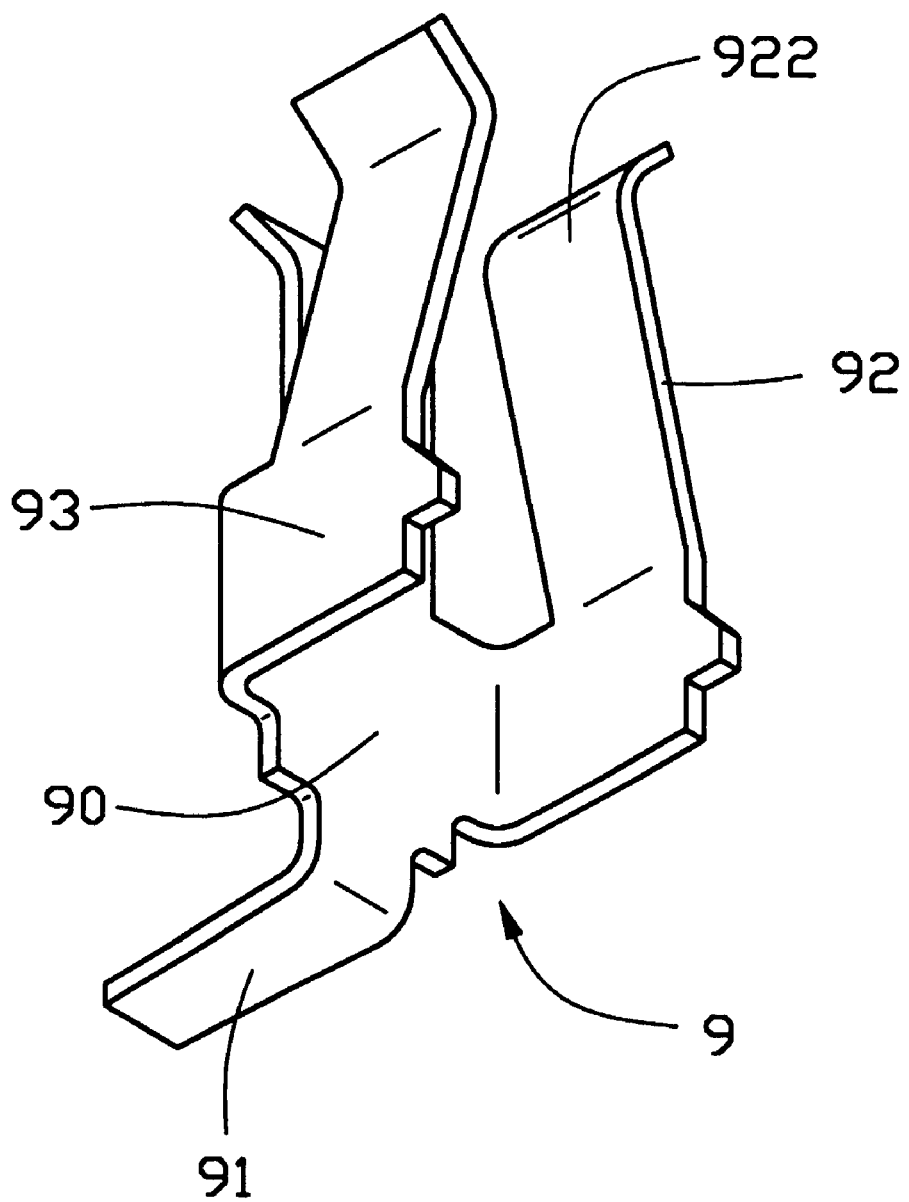
FIG. 3 is a perspective view of a terminal for use in a conventional connector.
Figure 4:
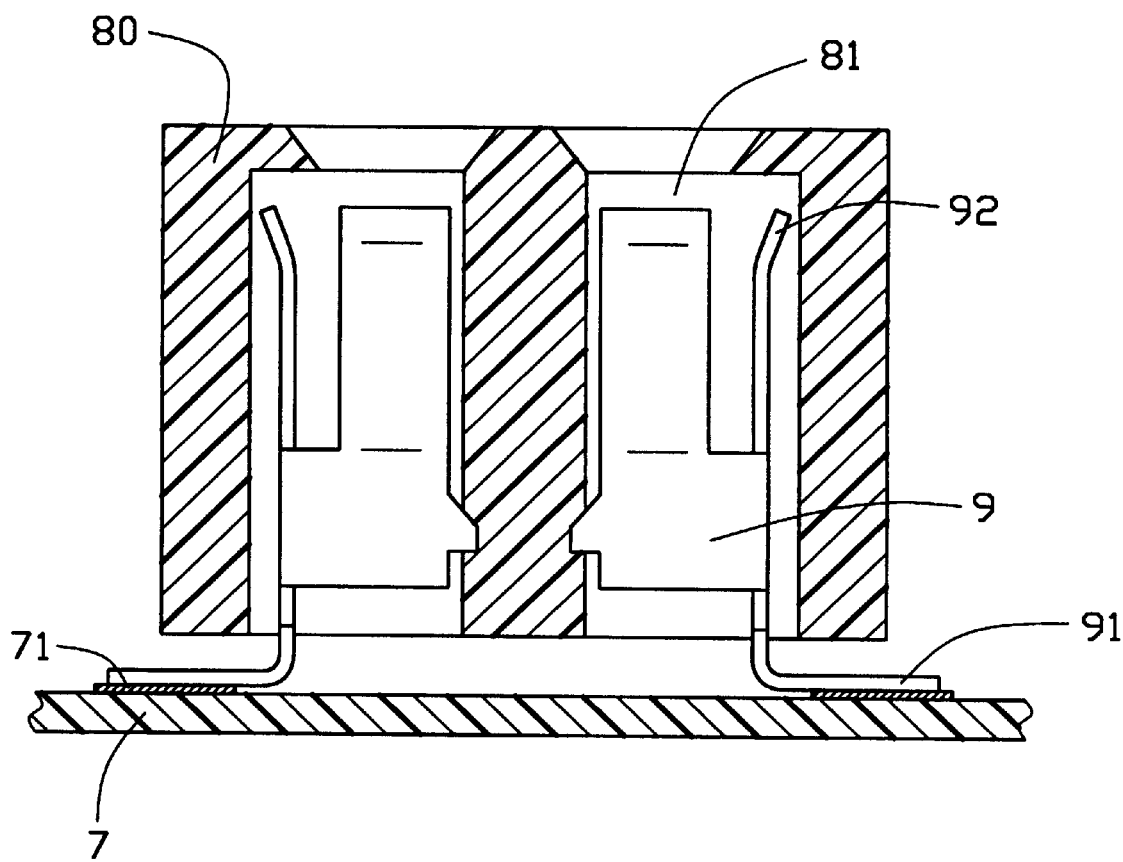
FIG. 4 is a cross-sectional view of the conventional connector.

Referring to FIGS. 1 and 2, an electrical connector 1 in accordance with the present invention comprises an insulating housing 10 and a plurality of terminals 20 which are formed by stamping a metal sheet (not shown) and are mounted in the housing 10. Each terminal 20 integrally forms s vertical, rectangular base plate 23 located in an inner and near a central rib 12 of the housing 10, i.e., confronting the inner wall 15 of the housing 10. Two mounting arms 24 outwardly and perpendicularly extend from opposite lateral edges of base plate 23, respectively, toward an outer wall 13 of the housing 10. Three engaging portions 22 extend vertically and upwardly from top edges of the base plate 23 and the mounting arms 24, respectively. A space 225 is defined between the engaging portions 22. Each engaging portion 22 defines an outer face 222 and an inner face 224 and forms an arced section 223 near a free end thereof in which when a pin terminal of a complementary connector (not shown) is inserted into the space 225, the pin terminal engages with the inner faces 223 of the engaging portions 22 about the arced sections 223. A step portion 213 horizontally and outwardly extends from a bottom edge of the base plate 23 and is so located substantially covering a bottom of the space 225. A horizontal soldering tail 212 extends outwardly from a bottom edge 214 of the step portion 213. Finally each mounting arm 24 has a fitting barb 221 formed at a free end thereof. The engaging portions 22, the mounting arms 24, the base plates 23 and horizontal sections 216 of the step portions 213 are located in contact passageways 11 vertically defined in the housing 10 beside the central rib 12 and through top and bottom faces 101, 102 of the housing 10. The horizontal section 216 of each step portion 213 extends substantially across a bottom of a corresponding passageway 11. The fitting barbs 221 of the mounting arms 24 fixedly engage with inner faces of the outer walls 13 of the housing 10 thereby securing the terminals 20 in the passageways 11. The step portions 213 each have a vertical section 215 extended vertically beyond the bottom face 102 of the housing 10 near the inner face of a corresponding outer wall 13. And the soldering tails 212 are each located below the housing 10 and outwardly extend beyond an outer face of a corresponding outer wall 13.

A plurality of solder pads 4 are disposed on a printed circuit board 3. The connector 1 is put on the printed circuit board 3 at a location that bottom faces 2121 of the solder tails 212 contact with the solder pads 4. When the printed circuit board 3 and the connector 1 are together subject to an IR reflow, the solder pads 4 are melted to electrically and mechanically connect the connector 1 and the printed circuit board together.

As the step portion of each of the terminals 20 of the connector 1 in accordance with present invention can function as a standoff to space the base plate 23 from the printed circuit board 3, molten solder is not easy to flow upwardly to reach the engaging portions 22. Furthermore, even if there is excess molten solder, it will only flow upwardly to the outer faces 222 of the engaging portions 22 as indicated by arrows of FIG. 2 and will not reach the inner faces 224 of the engaging portion 22, which are formed by a face of the metal sheet opposite to that forming the bottom face 2121 of the soldering tail 212 and are used for engaging with the terminal pin of the complementary connector. Thus, signal transmission quality will not be affected.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A surface mount connector, comprising:
    a housing defining a plurality of vertical passageways through top and bottom faces of the housing;
    a plurality of terminals formed by stamping a metal sheet being received in the passageways, respectively, each terminal comprising an engaging portion having an inner face for engaging with a terminal of a complementary connector and a soldering tail having a bottom face for surface mounting to a printed circuit board, said bottom face and inner face being formed by opposite faces of the metal sheet, respectively, whereby wicking of molten solder to contaminate the inner face of the engaging portion during mounting the connector to the printed circuit board can be effectively prevented wherein the terminal further comprises a step portion between the engaging portion and the solder tail, the step portion having a horizontal section extending substantially across the bottom of a corresponding passageway, and a vertical section connecting the solder tail.

2. The electrical connector in accordance with claim 1, wherein the housing has a central rib and the passageways are located beside the central rib, each terminal comprising a vertical base plate located near the central rib, the step portion being outwardly extended from a bottom edge of the base plate and the engaging portion being located above the base plate.

3. The electrical connector in accordance with claim 2, wherein the terminal has at least a mounting arm extending outwardly from the base plate to engage with an outer wall of the housing, the engaging portion being extended upwardly from the mounting arm.

4. The electrical connector in accordance with claim 3, wherein the vertical section of the step is located below the bottom face of the housing near the outer wall.

5. The electrical connector in accordance with claim 4, wherein the solder tail outwardly extends from a bottom edge of the vertical section beyond the outer wall.

6. A terminal for an electrical connector, comprising:
    a vertical and substantially rectangular base plate;
    a pair of arms extending alone a first direction form the base plate;
    two engaging portions vertically upwardly extending from the arms, respectively;
    a step portion horizontally extending in the first direction from a bottom edge of the base plate; and
    a solder tail horizontally extending in the first direction from a bottom edge of a vertical section of the step portion, said solder tail having a bottom face adapted for surface mounting to a printed circuit board.

7. The terminal in accordance with claim 6, wherein the arms each have a barb at a free end thereof adapted for engaging with a housing of the electrical connector.

8. The terminal in accordance with claim 7, wherein the engaging portions define a space therebetween, the step portion is located substantially at a bottom of the space.

9. A surface mount connector comprising:
    an insulative housing defining two rows of passageways extending in a vertical direction through top and bottom faces of the housing;
    a plurality of terminals respectively received within the corresponding passageways;
    each of said terminals comprising:
        a vertical base confronting a central rib of the housing;
        two mounting arms extending perpendicularly and outwardly from two lateral edges of the base;
        at least one engagement portion upwardly extending from one of said base and said mounting arms;
        a step portion outwardly extending from a bottom edge of the base with a vertical section downwardly extending around an outer wall of the housing; and
        a solder tail outwardly horizontally extending from a bottom edge of said vertical section; wherein
        the step portion generally blocks the corresponding passageway in said vertical direction.

* * * * *